March 16, 1937. H. C. RENTSCHLER ET AL Re. 20,297
AMPLIFICATION SYSTEM FOR GLOW RELAY DEVICES
Original Filed Dec. 7, 1928
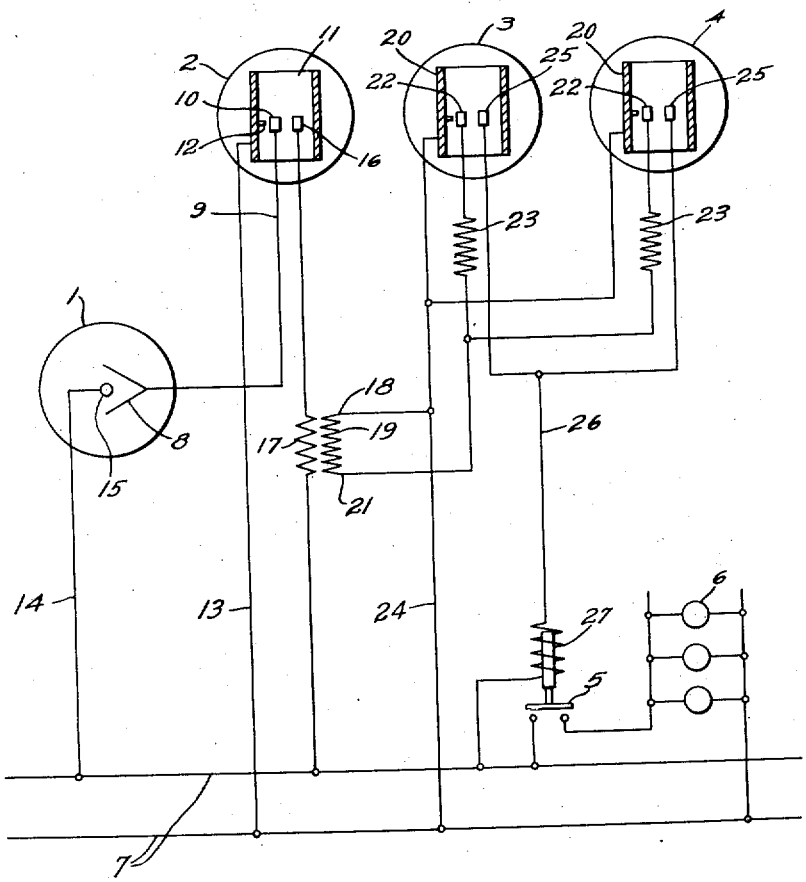
WITNESSES:
C. J. Weller.
Hymen Diamond.
INVENTORS
Harvey C. Rentschler and
Donald E. Henry.
BY
F. W. Lyle.
ATTORNEY Reissued Mar. 16, 1937 Re. 20,297

UNITED STATES PATENT OFFICE 20,297

AMPLIFICATION SYSTEM FOR GLOW RELAY DEVICES

Harvey C. Rentschler, East Orange, and Donald E. Henry, Bloomfield, N. J., assignors, by mesne assignments, to Westinghouse Electric & Manufacturing Company, East Pittsburgh, Pa., a corporation of Pennsylvania Original No. 1,982,829, dated December 4, 1934, Serial No. 324,557, December 7, 1928. Application for reissue August 15, 1936, Serial No. 96,204

3 Claims. (Cl. 250—27)

This invention relates to electrical discharge devices of the gaseous conduction type employing a starting anode for initiating a discharge therein in response to feeble electrical currents and utilizing such feeble discharge to enable a main discharge having a relatively large current, to be started. More particularly, the invention relates to a system for operating such devices.

It is well known that the voltage required to initiate an electrical discharge in a glow discharge device is higher than that required to maintain the discharge once it has started.

Thus, for instance, in a negative glow discharge device employing spaced apart electrodes in a gaseous atmosphere and operating in the absence of thermionic emission, by a proper choice of electrode materials, electrode spacing, gas pressure, etc., the discharge may be made to start at potentials as low as 110 to 120 volts while the discharge once started will continue to operate after the potential has dropped to as low as from 85 to 90 volts.

This difference in starting and operating potential is due largely to the high resistance imposed by the cathode dark space. Upon initiating a discharge in the devices this cathode resistance is broken down and permits the discharge to be maintained at a voltage lower than the starting potential or it enables another independent discharge to be started in the tube at a materially lower voltage than that required to start the discharge, in the absence of the auxiliary discharge.

It has been found that there is a definite and critical spacing of the electrodes for a particular gas and a particular pressure thereof at which the voltage and current required to start a discharge in the device is a minimum. Moreover, whereas devices of this nature may readily carry current up to several hundred milliamperes, the amount of current required to start the discharge may be exceedingly small, that is in the nature of a micro-ampere.

In Rentschler Patent No. 1,840,055, issued January 5, 1932, there is described a device which makes use of the above phenomena for the production of an extremely sensitive glow-relay tube. Briefly the device consists of an envelope containing a gaseous medium having a cathode of large area and a main anode and an auxiliary or starting anode of small areas.

The main anode is positioned with respect to the cathode so that a considerably higher voltage is required to start a discharge between said electrode and the cathode than is ordinarily available from the circuit in which these electrodes are connected, whereas, the starting anode is differently spaced with respect to the cathode and may be constructed of a different material from the main anode so that a discharge may be started between such starting anode and the cathode at a considerably lower voltage than that necessary to initiate the main discharge.

The starting anode is positioned at the critical distance from the cathode, or from an extension of the cathode at which the minimum voltage is required to start the discharge with the particular gas at the pressure employed. The main anode is arranged at a greater distance from the cathode.

As a consequence of this construction, if a predetermined voltage is impressed between the main anode and the cathode, somewhat lower than that necessary to initiate a discharge therebetween but sufficiently high to maintain such a discharge after it is once started and if a second source of potential is applied between the starting anode and the cathode of sufficient voltage to initiate a discharge between such electrodes in response to some external condition permitting only a feeble current to flow in the starting anode circuit, the main anode discharge may be started upon the initiation of the discharge from the starting anode.

With such a device the extremely feeble currents, obtained for instance from a photo-electric cell, which may be in the nature of a micro-ampere or a few micro-amperes, or even less produced in the circuit including the starting anode which, for convenience, is termed the in-put circuit, will initiate a discharge in the main anode circuit or out-put circuit of several hundred milliamperes which is sufficient to operate a sensitive relay. However, when such a sensitive glow-relay tube is operated with high current out-put, near the limits of the tube, the tube is likely to become heated and its sensitivity and reliability decreased. It is therefore, often necessary to operate such devices at lower out-put currents when extreme sensitivity is required, than that necessary to directly operate heavy mechanical relays.

One of the objects of the present invention is, therefore, to provide a system employing sensitive glow-relay tubes of the nature described in which large out-put currents may be obtained without impairing the sensitivity of the system.

A further object is to provide an amplifying system for increasing the current obtained from a glow-relay tube.

Other objects and advantages will appear hereinafter.

In accordance with our invention we operate a starting anode tube or glow-relay in response to feeble electric currents, such as those obtained from a photo-electric cell subjected to light variations and we employ the out-put current obtained from the main anode circuit of such a tube to supply the in-put current for one or more less sensitive starting anode tubes of larger out-put capacity.

These amplifying tubes may be connected in parallel and supply a relatively heavy out-put current for directly operating mechanical relays or switches for setting into operation any desired electrical apparatus.

In order that the invention may be more fully understood reference will be had to the accompanying drawing in which the single figure illustrates an electrical system employing our starting anode tubes.

In the drawing the current obtained from a photo-electric cell 1 is employed to create a discharge through a starting anode tube 2 which in turn supplies current for setting into operation a pair of less sensitive starting anode tubes 3 and 4 of greater out-put capacity which are connected electrically in parallel. The current obtained from the tubes 3 and 4 is used to operate an electrical switch 5 for supplying current to a bank of lamps 6. The current for operating these devices is obtained from a 110 volt A. C. line 7.

The cathode 8 of the photo-electric cell is connected with a wire 9 to the starting anode 10 of the glow-relay 2, the cathode 11 of which has a starting tip or extension 12 projecting into close proximity to the starting anode 10. The cathode 11 is joined through the conductor 13 to one side of the line 7, the opposite side of which is connected through the conductor 14 with the anode 15 of the photo-electric cell 1.

Small currents flowing through the photo-electric cell in response to an increase in illumination of the photo-electric cell, create a discharge between the starting anode 10 and the cathode 11. This discharge causes the tube to break down and a heavier current discharge to be started between the main anode 16 of the glow relay tube, which is connected to one side of the line 7 through the primary of a transformer 17, and the cathode 11 which is connected to the opposite side of the line.

The out-put current obtained from the glow-relay tube 2 is utilized to supply the in-put current to the starting anodes of the amplifying tubes 3 and 4. One terminal 18 of the secondary 19 of the transformer 17 is connected to the cathodes 20 of each of the amplifying tubes and the opposite terminal 21 of the secondary 18 is connected to each of the starting anodes 22 of the amplifying tubes through suitable resistance 23 so that a discharge occurs in the amplifying tubes, between the starting anode and the cathode, in response to the discharge in the out-put circuit of the first relay tube 2. The cathodes 20 of the amplifying tubes are connected to the line 7 by the conductor 24 and the main anodes 25 of these tubes are connected to the opposite side of the line 7 through the conductor 26 and the winding 27 of the switch 5, so that upon initiation of the auxiliary discharge in these tubes the main discharge will start and supply a relatively heavy current for operating the switch 5. The switch 5 controls the current to a bank of lamps 6.

With the arrangement shown, the small current of a fraction of a micro-ampere or more, produced in the photo-electric cell 1 may be utilized to initiate the discharge through the first sensitive starting anode tube and the out-put current obtained from such tube utilized to initiate the discharge in the less sensitive amplifying starting anode tubes to supply a heavy current for directly operating the switch 27.

It is obvious of course that various changes may be made in the electrical connections for operating the amplifying tubes by the current obtained from the tube 2 and the current obtained from the amplifying tube may be utilized in various manners and we do not desire to be limited to the specific electrical connections shown and described except in accordance with the appended claims.

The system described may be utilized to control the illumination in offices, factories, street lighting systems, etc., to automatically light and extinguish the lights in accordance with definite illuminating conditions. For instance, if the photo-electric cell 1 is subjected to increasing day-light illumination and the photo-electric cell is adjusted to permit a predetermined current to flow therethrough sufficient to initiate a discharge in the relay tubes 2, when the day-light illumination is sufficient for the purpose required, the amplified current obtained from the amplifier tubes 3 and 4 will open the switch 5 and turn off the lamps 6. When the day-light illumination decreases below normal, the current flow in the photo-electric cell 1 becomes too small to maintain the discharge in the relay tube 2 and as a consequence the winding 27 becomes de-energized, allowing the switch 5 to close and the lamps to be lighted.

We claim as our invention:

1. An electric system including a glow relay tube of the starting anode type having an envelope, a gas, a cathode, a starting anode and a main anode therein, comprising a starting circuit including a source of potential, the starting anode and the cathode of said tube and high impedance means for controlling current flow between said starting anode and cathode, an output circuit including a source of potential, said main anode and cathode, a third circuit magnetically coupled with said output circuit, said third circuit including the starting anode and cathode of a second relay tube having a higher output capacity than said first mentioned tube, a fourth circuit including said cathode and a main anode of said second relay tube and means for impressing a potential between said main anode and cathode, and actuable means associated with said fourth circuit and adapted to be actuated upon current flow through said fourth circuit, said first mentioned tube being sensitive and said second tube being less sensitive than said first mentioned tube.

2. An electric system including a glow relay tube of the starting anode type having an envelope, a gas, a cathode, a starting anode and a main anode therein, comprising a starting circuit including a source of potential, the starting anode and the cathode of said tube and high impedance means all in series, an output circuit including said source of potential, said main anode and said cathode of said tube and the primary winding of a transformer in series, a third circuit including the starting anode and the cathode of a second glow relay tube of the starting anode type, and also a secondary of said transformer, a fourth circuit including the cathode and main anode of said second tube and said source of potential and adapted to carry sufficient current to actuate external means, said second tube having a higher output capacity than said first tube and actuable means associated with said output circuit, said first mentioned tube being sensitive and said second tube being less sensitive than said first mentioned tube.

3. In a control system, a set of electrodes between which a discharge is to pass, means for controlling the discharge between said electrodes, the properties of said electrodes and said discharge controlling means being such that only a comparatively small current is required to be transmitted between said means and at least one of said electrodes to control the discharge between said electrodes, power supply means, the current of said discharge being substantially larger than said controlling current, means for coupling said power supply means to said electrodes and to said discharge controlling means to impress potentials between said electrodes and on said discharge-controlling means, said means including means for predetermining the relationship of the last said potentials, an additional set of electrodes between which a discharge is to pass, additional means for controlling the discharge between said additional set of electrodes, the properties of the last-named electrodes and discharge-controlling means being such that a comparatively large current, substantially equivalent to the current transmitted between the first-named set of electrodes, is required to be transmitted between said discharge controlling means and at least one of said electrodes to control the discharge between said additional set of electrodes and means for coupling the first-named set of electrodes to the last-named discharge controlling means to control the discharge between said additional set of electrodes.

HARVEY C. RENTSCHLER.
DONALD E. HENRY.